United States Patent [19]

Hsue et al.

[11] Patent Number: 5,318,921
[45] Date of Patent: Jun. 7, 1994

[54] METHOD FOR MAKING A HIGH DENSITY ROM OR EPROM INTEGRATED CIRCUIT

[75] Inventors: Chen-Chiu Hsue; Ming-Tzong Yang, both of Hsin-chu, Taiwan

[73] Assignee: United Microelectronics Corporation, Hsinchu, Taiwan

[21] Appl. No.: 55,867

[22] Filed: May 3, 1993

[51] Int. Cl.$^5$ .................... H01L 21/70; H01L 27/00
[52] U.S. Cl. ........................ 437/52; 437/43; 437/48; 437/50
[58] Field of Search .............. 437/47, 52, 60, 919, 437/43

[56] References Cited

U.S. PATENT DOCUMENTS 4,833,514  5/1989  Esquivel et al. ............... 437/43
5,200,355  4/1993  Choi et al. .................... 437/52

Primary Examiner—Olik Chaudhuri
Assistant Examiner—H. Jey Tsai
Attorney, Agent, or Firm—George O. Saile

[57] ABSTRACT

An insulating layer structure is formed over semiconductor device structures in and on a semiconductor substrate. A conductive polysilicon layer covers the insulating layer which is covered by a silicon oxide layer. The oxide layer is now patterned by lithography and etching. This patterning leaves a first pattern of the oxide over a first designated plurality of polysilicon conductor lines and a second pattern between the oxide which exposes the polysilicon layer over a second designated plurality of polysilicon conductor lines plus the planned spacing between the first and second plurality of polysilicon conductor lines. A uniform thickness silicon nitride layer is deposited over the oxide layer and the exposed polysilicon layer wherein the thickness is the width of the planned spacing. The nitride layer is anisotropically etched to produce sidewall structures having the width of the planned spacing. The exposed polysilicon layer is oxidized. The sidewall structures are removed by etching. The exposed polysilicon layer is anisotropically etched to form closely spaced polysilicon conductor lines. The silicon oxide layers over the polysilicon conductor lines are removed as by etching. N+ ions are implanted into the silicon substrate under the spacing between the polysilicon conductor lines to form bit lines. An insulating layer structure is formed over the bit lines. Processing continues as before to form a second set of polysilicon lines which form the word lines.

15 Claims, 9 Drawing Sheets

METHOD FOR MAKING A HIGH DENSITY ROM OR EPROM INTEGRATED CIRCUIT

Related U.S. Pat. No. 5,236,853 entitled "SELF-ALIGNED DOUBLE DENSITY POLYSILICON LINES FOR ROM AND EPROM" by C.C. Hsue filed on Feb. 21, 1992.

BACKGROUND OF THE INVENTION

(1) Field of the Invention

This invention relates to the fabrication of integrated circuit devices and more particularly to a method of making self-aligned and closely spaced polysilicon bit lines and word lines for read only memory (ROM) and the like.

(2) Description of the Prior Art

Lithography resolution is limited by optical design. The technology of read only memory is therefore limited, because of the inability to form very closely spaced polycrystalline silicon (polysilicon) conductor lines over the surface of a read only memory.

Researches in the integrated circuit field generally have used the sidewall technology to form smaller spaces than normally available through lithography for various purposes. Examples of this type of application is shown in U.S. Pat. No. 4,502,914 to H.J. Trumpp et al; U.S. Pat. No. 4,839,305 to J.K. Brighton and U.S. Pat. No. 4,868,136 to A. Ravaglia.

However, in the read only memory field the researchers have used two layer polysilicon structures to make more densely packed memories such as described in Y. Naruke U.S. Pat. No. 5,002,896. While these have been successful, it is clear that if a single layer, closely spaced technology were available there are advantages over the two layer structures. One advantage for the single layer structure is in the planarity of the surface over a two layered structure. Other advantages are cost effectiveness and process simplicity.

SUMMARY OF THE INVENTION

A principal object of the invention is to provide an effective and very manufacturable method to fabricate a read only memory (ROM) or the like integrated circuit wherein the polysilicon conductive lines are very closely spaced, on the order of 0.1 to 0.3 micrometers apart.

In accordance with this invention, a new method of forming a closely spaced self-aligned polysilicon Pattern of conductive lines is achieved. The method involves forming semiconductor device structures in and on a semiconductor substrate. An insulating layer structure is formed over the semiconductor device structures. A conductive polysilicon layer is formed over the insulating layer. A silicon oxide layer is formed over the polysilicon layer. The oxide layer is now patterned by lithography and etching. The patterning of the oxide layer leaves a first pattern of the oxide over a first designated plurality of polysilicon conductor lines and a second pattern between the oxide which exposes the polysilicon layer over a second designated plurality of polysilicon conductor lines plus the planned spacing between the first and second plurality of polysilicon conductor lines. A uniform thickness silicon nitride layer is deposited over the oxide layer and the exposed polysilicon layer wherein the thickness is the width of the planned spacing. The nitride layer is anisotropically etched to produce sidewall structures having the width of the planned spacing. The exposed polysilicon layer is oxidized to form a silicon oxide layer thereon. The sidewall structures are removed by etching. The exposed polysilicon layer is anisotropically etched to form the closely spaced polysilicon conductor lines. The silicon oxide layers over the polysilicon conductor lines are removed as by etching. N+ ions are implanted into the silicon substrate under the spacing between the polysilicon conductor lines to form bit lines. An insulating layer structure is formed over the bit lines. A conductive polysilicon layer is formed over the insulating layer. A silicon oxide layer is formed over the polysilicon layer. The oxide layer is now patterned by lithography and etching. The patterning of the silicon oxide layer leaves a first pattern of the oxide over a first designated plurality of polysilicon conductor lines and a second pattern between the oxide which exposes the polysilicon layer over a second designated plurality of polysilicon conductor lines plus the planned spacing between the first and second plurality of polysilicon conductor lines. A uniform thickness silicon nitride layer is deposited over the silicon oxide layer and the exposed polysilicon layer wherein the thickness is the width of the planned spacing. The nitride layer is anisotropically etched to produce sidewall structures having the width of the planned spacing. The exposed polysilicon layer is oxidized to form a silicon oxide layer thereon. The sidewall structures are removed by etching. The exposed polysilicon layer is anisotropically etched to form the closely spaced polysilicon conductor lines. The silicon oxide layers over the polysilicon conductor lines are removed as by etching. This second set of polysilicon conductor lines form the word lines.

BRIEF DESCRIPTION OF THE DRAWINGS

In the accompanying drawings forming a material part of this description, there is shown:

FIG. 8 shows the cross-section along 8—8 of FIG. 12.

FIG. 18 shows the cross-section across 18—18 of FIG. 16.

DESCRIPTION OF THE PREFERRED EMBODIMENTS

Figure 1:
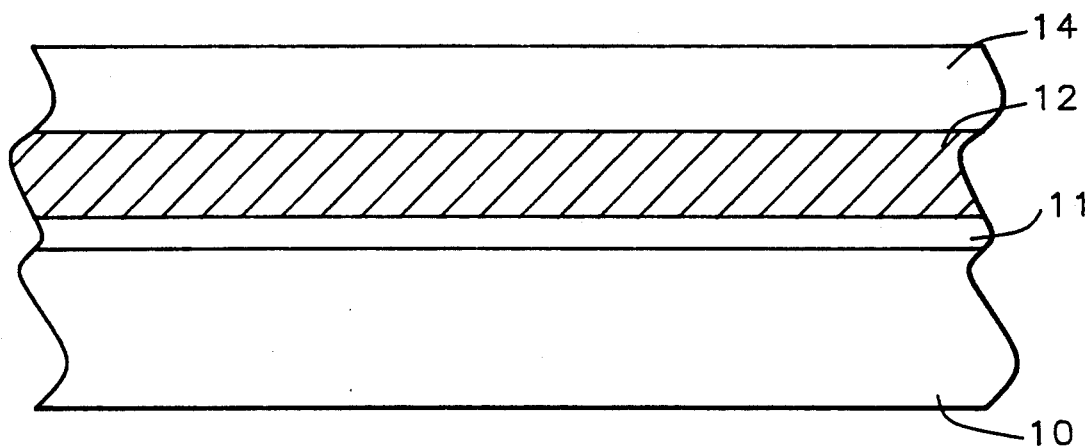
FIGS. 1 through 5 schematically illustrate in cross-sectional representation one preferred embodiment of forming closely spaced polysilicon bit lines of this invention.

The process of forming bit lines will now be described referring to FIGS. 1 through 4. Referring now more particularly to FIG. 1, there is illustrated a partially completed ROM structure in which there is a monocrystalline silicon semiconductor substrate 10. The insulating layer 11 is formed on top of the silicon substrate 10 The insulating layer 11 is preferably composed of silicon nitride and has a thickness of between about 100 and 2000 Angstroms.

A polysilicon layer 12 is formed by low pressure chemical vapor deposition (LPCVD) using silane at about 620° C. The preferred thickness of the polysilicon layer 12 is between about 1000 to 6000 Angstroms. The polysilicon layer 12 is doped with phosphorus oxychloride at about 900° C. Alternatively, the polysilicon layer can be doped in situ, that is during its deposition.

Figure 2:
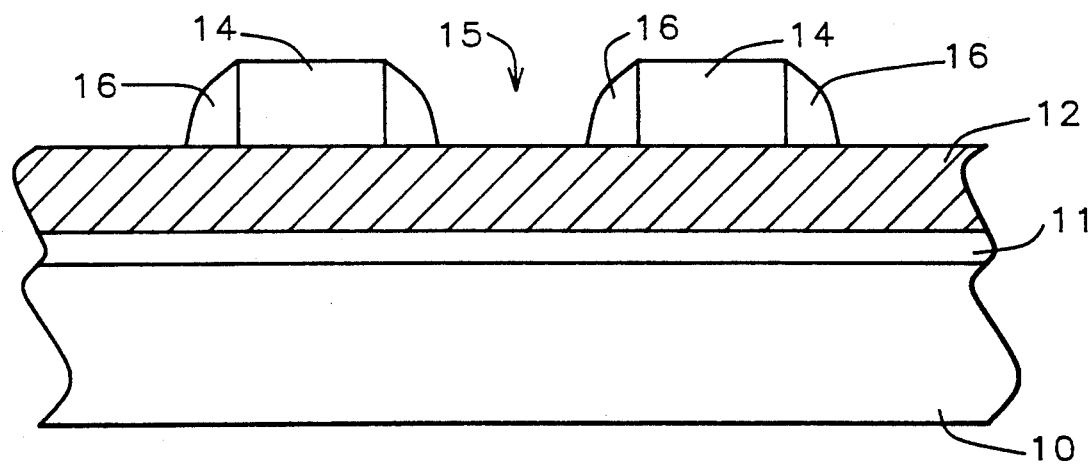

A layer of silicon dioxide 14 is deposited over the polysilicon layer 12. This is done by Chemical Vapor Deposition to a thickness of between 1000 and 6000 Angstroms. Conventional lithography and oxide dry etch are now used to pattern the silicon oxide to the critical pattern necessary to give the desired narrowly spaced, single level polysilicon conductor pattern. As shown in FIG. 2, the patterning of the oxide layer 14 leaves a first pattern of the oxide 14 over a first designated plurality of polysilicon conductor lines and a second pattern between the oxide which exposes the polysilicon layer at windows 15 over a second designated plurality of polysilicon conductor lines plus the planned spacing between the first and second plurality of polysilicon conductor lines.

A uniform thickness silicon nitride layer 16 is deposited over the silicon oxide layer and the exposed polysilicon layer wherein the thickness of the silicon nitride layer is the width of the planned spacing. The silicon nitride spacers 16 are now formed by anisotropically etching the silicon nitride layer 16 using conventional gases under the standard conditions. The thickness of the silicon nitride is critical to the process and is between about 500 and 5000 Angstroms.

Figure 3:
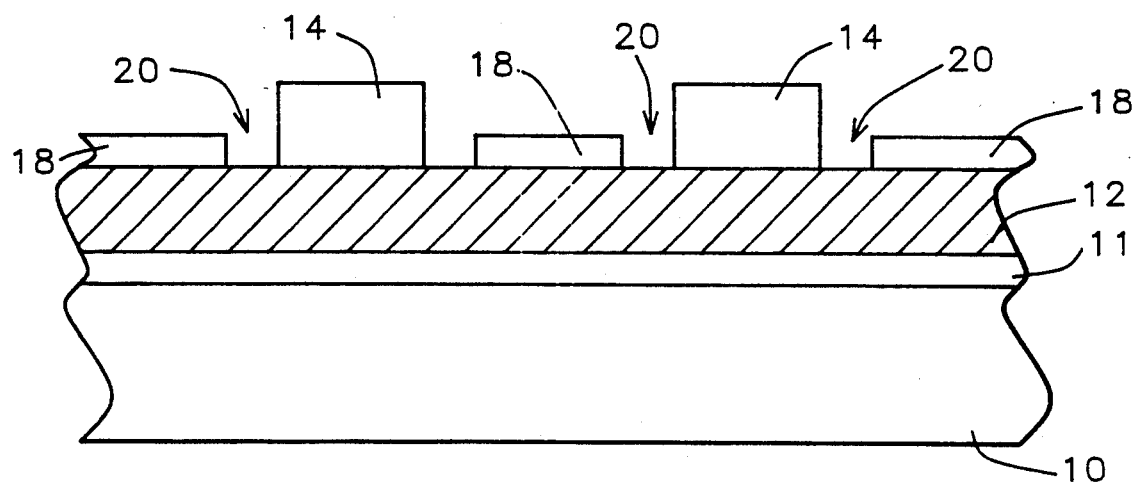

The exposed surfaces of polysilicon layer 12 are oxidized by conventional thermal oxidation in wet or dry oxygen at about 900° C. through windows 15 resulting in an overlying silicon dioxide layer. The thickness of the silicon oxide layer is between about 200 to 3000 Angstroms. An etch, which may be preferably wet chemical is performed to remove the silicon nitride sidewall structures 16 leaving windows 20, as shown in FIG. 3. This critical step involves first applying a dip etch of HF or an ammonia buffered HF to remove the thin silicon oxide (not shown) over the silicon nitride 16. Then hot phosphoric acid is used to selectively remove the silicon nitride spacers 16. Only the hot phosphoric acid gives the best possible selectivity vs. silicon oxide. This is a self-aligned step requiring no lithography step and results in a spacing of less than 0.8 micrometers for example for 0.8 micrometers technology. The spacing would be less than about 0.5 micrometers for 0.5 micrometer technology.

Figure 4:
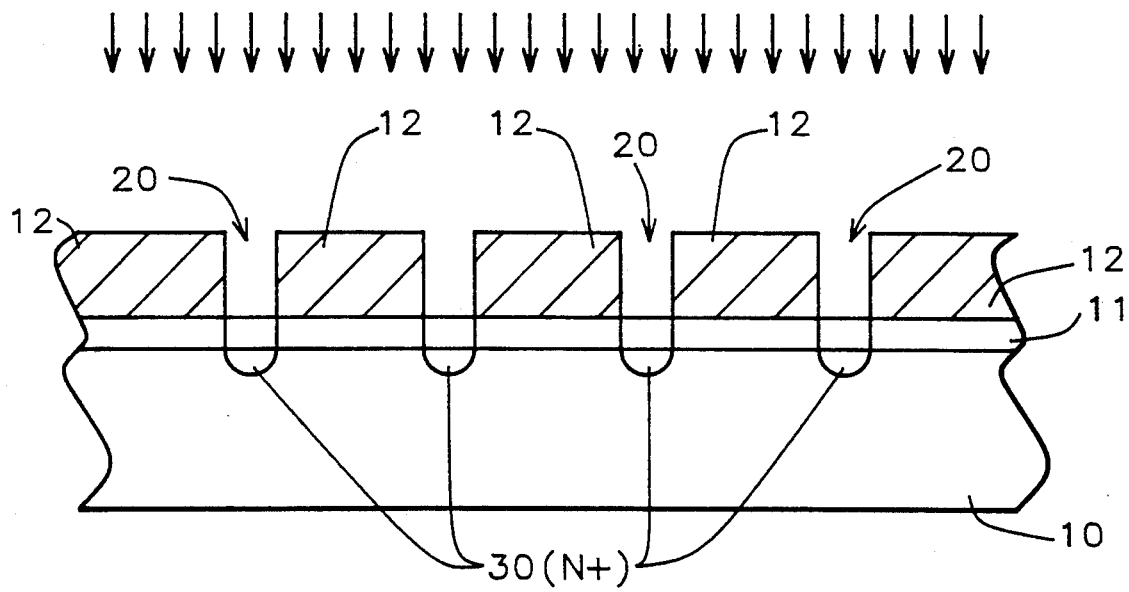

A standard anisotropic polysilicon etch is performed to extend the windows 20 to the insulating layer 11, as illustrated in FIG. 4. The removal of the silicon dioxide mask 14 is accomplished by use of a hydrofluoric acid. To complete the closely spaced conductive polysilicon bit line construction, N+ions, such as arsenic, are implanted 25 into the substrate 10 through the polysilicon mask 12 to form the buried bit lines 30.

Figure 5:
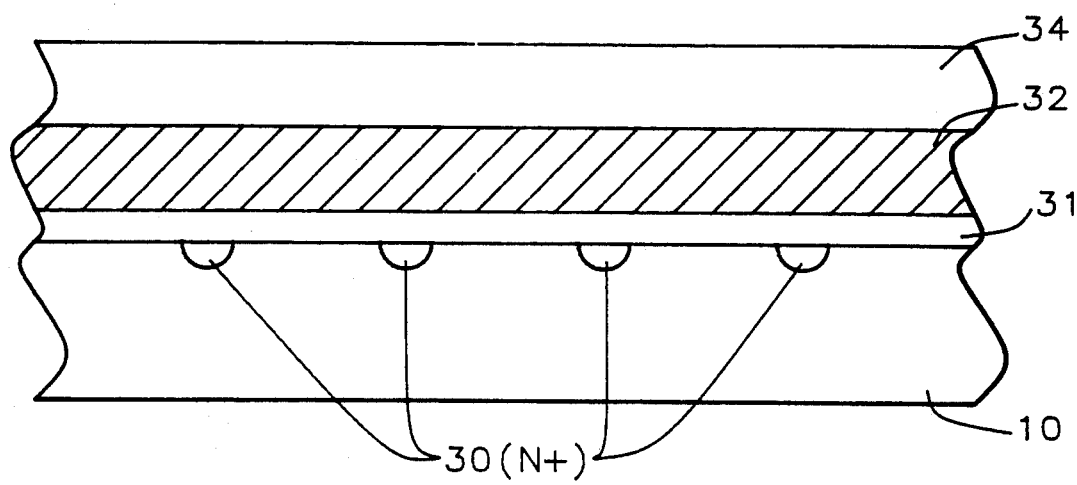

The process of forming word lines will be described referring to FIGS. 5 through 8. Referring now to FIG. 5, after the bit line formation is complete, polysilicon 12 and silicon nitride layer 11 are removed by a plasma etch for both layers 11 and 12 or a wet chemical etch (KOH for polysilicon layer 12 and $H_2P_2O_5$ for the silicon nitride layer). A gate oxide layer 31 is deposited over semiconductor substrate 10 and bit lines 30 to a thickness of between about 100 and 300 Angstroms. A polysilicon layer 32 is formed by low pressure chemical vapor deposition (LPCVD) using silane at about 620° C. The preferred thickness of the polysilicon layer 32 is between about 1000 to 6000 Angstroms. The polysilicon layer 32 is doped with phosphorus oxychloride at about 900° C. or by implantation. Alternatively, the polysilicon layer can be doped in situ, that is during its deposition.

Figure 6:
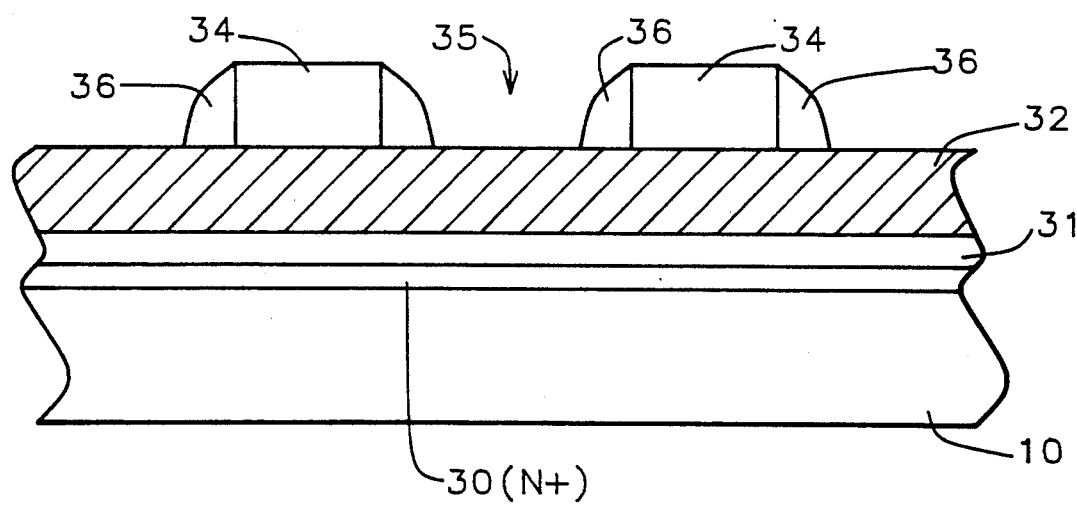
FIGS. 6 through 8 schematically illustrate in cross-sectional representation one preferred embodiment of forming closely spaced polysilicon word lines of this invention.

A layer of silicon dioxide 34 is deposited over the polysilicon layer 32. This is done by Chemical Vapor Deposition to a thickness of between 1000 and 6000 Angstroms. Conventional lithography and oxide dry etch are now used to pattern the silicon oxide to the critical pattern necessary to give the desired narrowly spaced, single level polysilicon conductor pattern. As shown in FIG. 6, the patterning of the oxide layer 34 leaves a first pattern of the oxide 34 over a first designated plurality of polysilicon conductor lines and a second pattern between the oxide which exposes the polysilicon layer at windows 35 over a second designated plurality of polysilicon conductor lines plus the planned spacing between the first and second plurality of polysilicon conductor lines.

A uniform thickness silicon nitride layer 36 is deposited over the silicon oxide layer and the exposed polysilicon layer wherein the thickness of the silicon nitride layer is the width of the planned spacing. The silicon nitride spacers 36 are now formed by anisotropically etching the silicon nitride layer 36 using conventional gases under the standard conditions. The thickness of the silicon nitride is critical to the process and is between about 500 and 5000 Angstroms.

Figure 7:
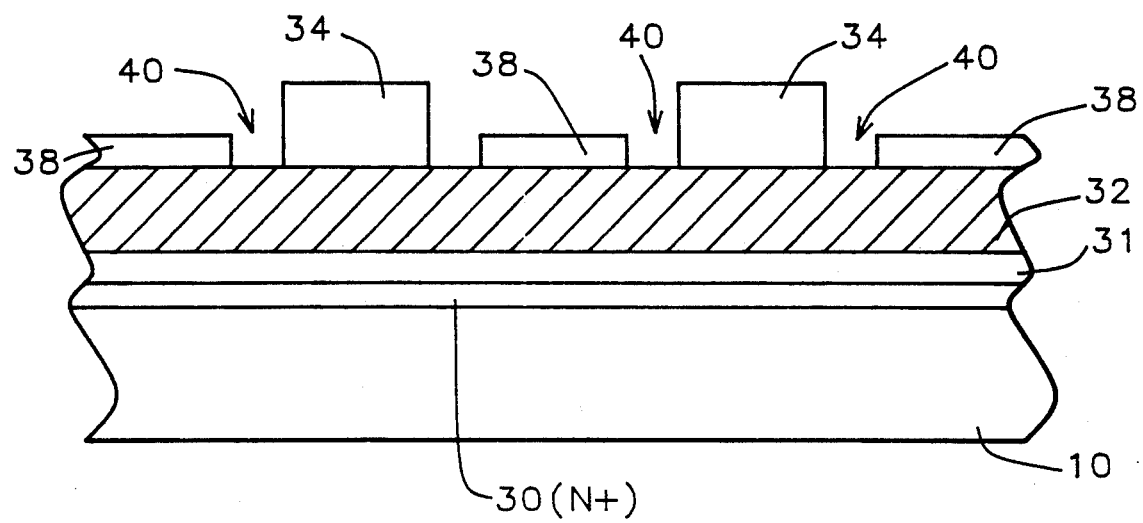

The exposed surfaces of polysilicon layer 32 are oxidized by conventional thermal oxidation in wet or dry oxygen at about 900° C. through windows 35 resulting in an overlying silicon dioxide layer. The thickness of the silicon oxide layer is between about 200 to 1000 Angstroms. An etch, which may be preferably wet chemical is performed to remove the silicon nitride sidewall structures 36 leaving windows 40, as shown in FIG. 7. This critical step involves first applying a dip etch of HF or an ammonia buffered HF to remove the thin silicon oxide (not shown) over the silicon nitride 36. Then hot phosphoric acid is used to selectively remove the silicon nitride spacers 36. Only the hot phosphoric acid gives the best possible selectivity vs. silicon oxide. This is a self-aligned step requiring no lithography step and results in a spacing of less than 0.8 micrometers for example for 0.8 micrometers technology. The spacing would be less than about 0.5 micrometers for 0.5 micrometer technology.

Figure 8:
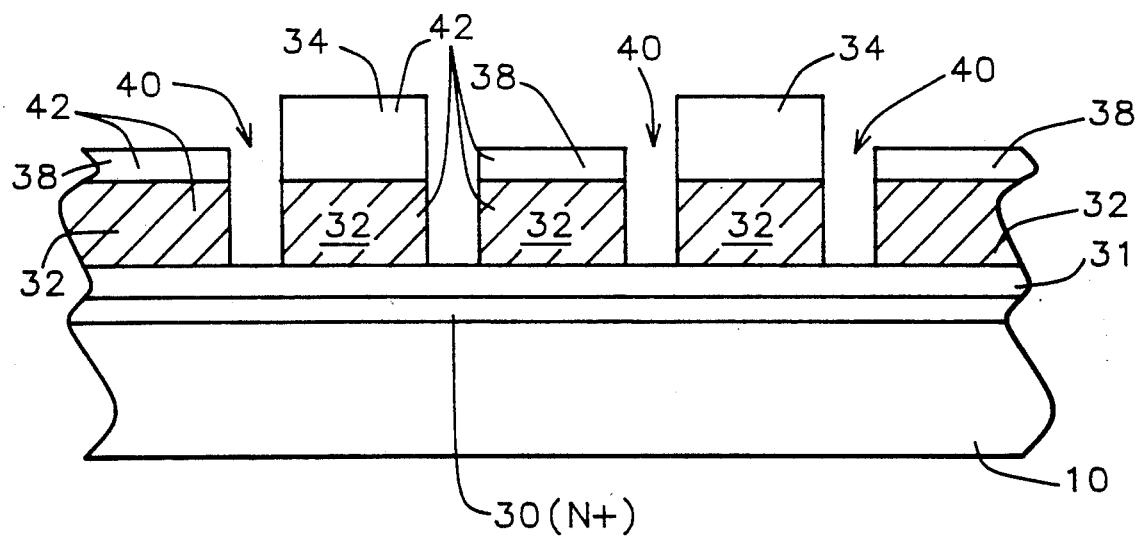

A standard anisotropic polysilicon etch is performed to extend the windows 40 to the insulating layer 31, as illustrated in FIG. 8. The removal of the silicon dioxide mask 34 is accomplished by use of a hydrofluoric acid to complete the formation of the closely spaced polysilicon word lines 42.

Figure 9:
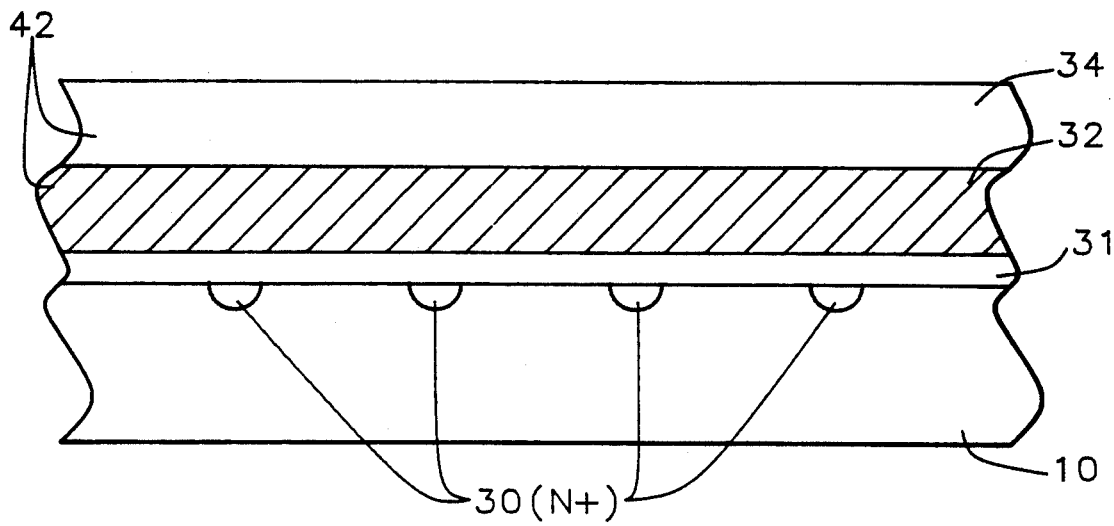
FIG. 9 shows a cross-section along 9—9 of FIG. 12.
Figure 10:
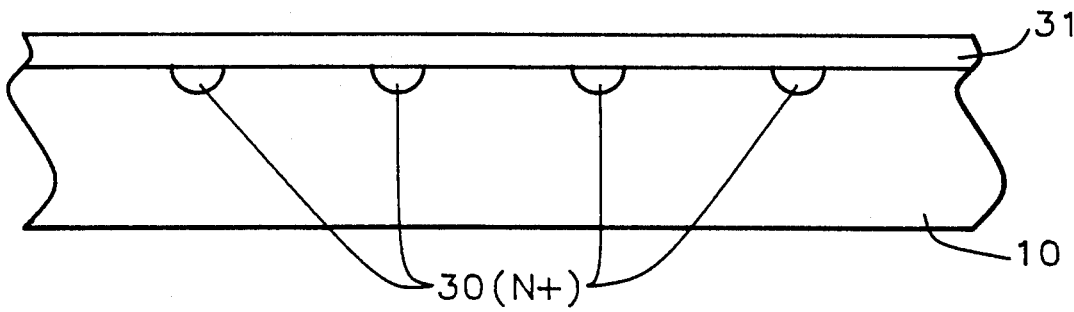
FIG. 10 shows a cross-section along 10—10 of FIG. 12.
Figure 11:
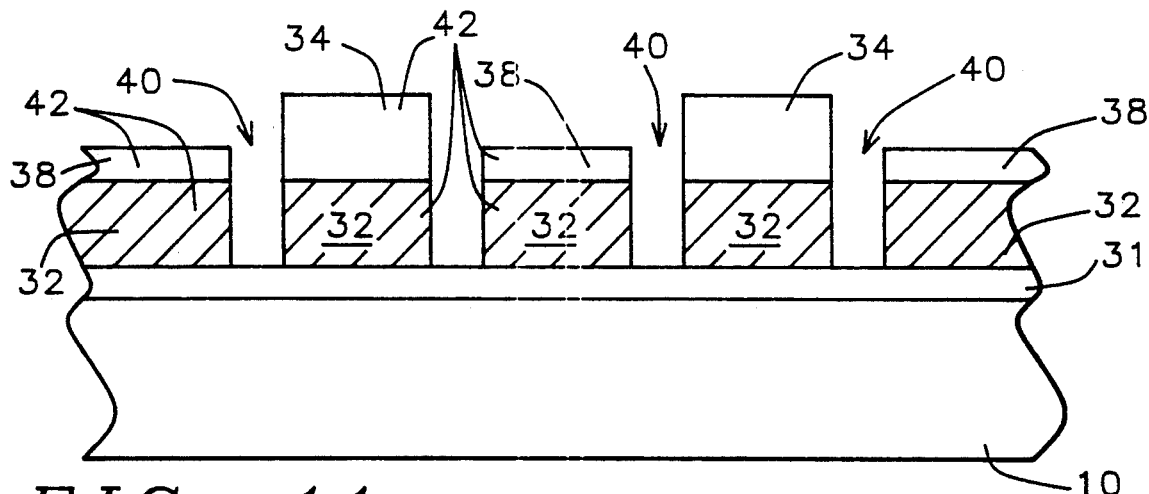
FIG. 11 shows a cross-section along 11—11 of FIG. 12.
Figure 12:
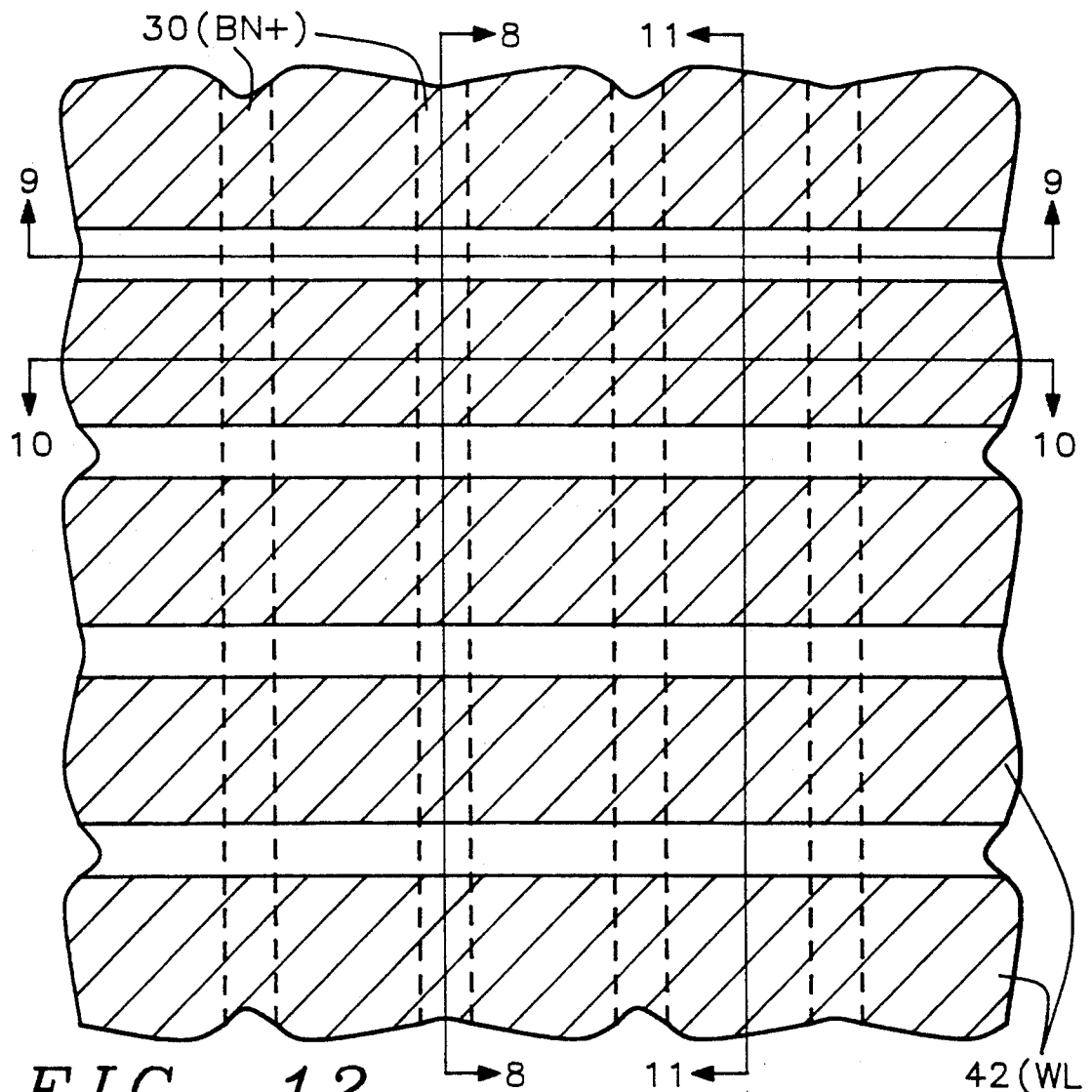
FIG. 12 is a schematic illustration of a top view of a portion of the integrated circuit of the invention.

FIG. 12 is a top view of either a ROM or EPROM integrated circuit device and illustrates the planer view of the structure relationship of the word lines WL or 42 to the buried N+ bit lines BN+ or 30. The cross-section 8—8 of FIG. 12 along a bit line 30 is shown in FIG. 8. The cross-section of 9—9 along a word line 42 is shown in FIG. 9. The cross-section 10—10 between word lines 42 is shown in FIG. 10. The cross-section 11—11 between bit lines 30 is shown in FIG. 11.

Figure 13:
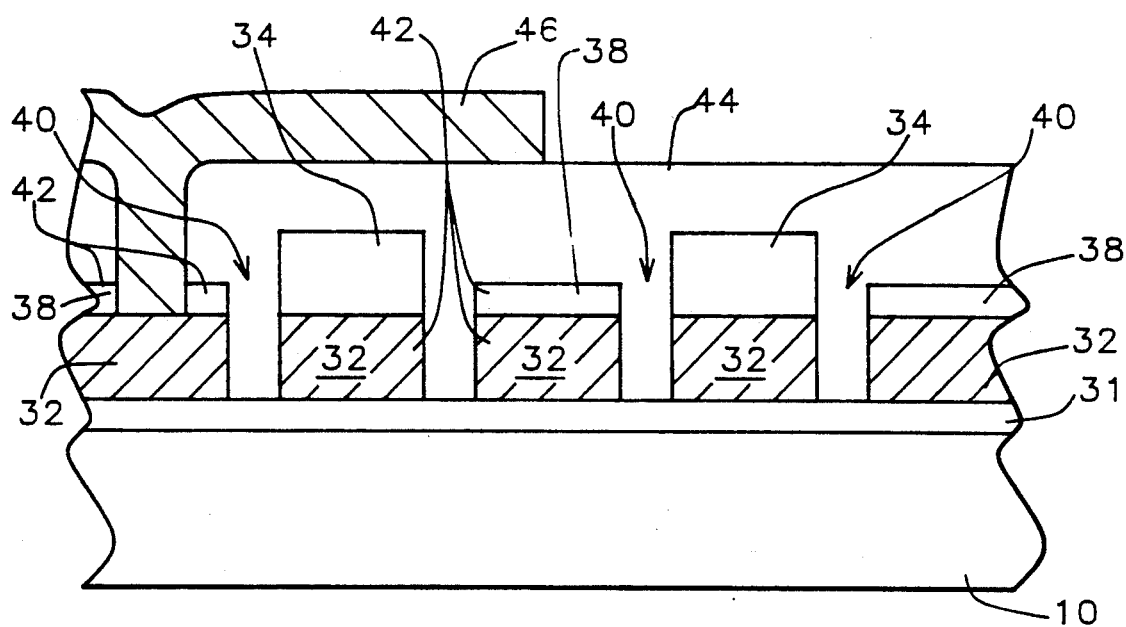
FIG. 13 shows a cross-section along 13—13 of FIG. 17.
Figure 14:
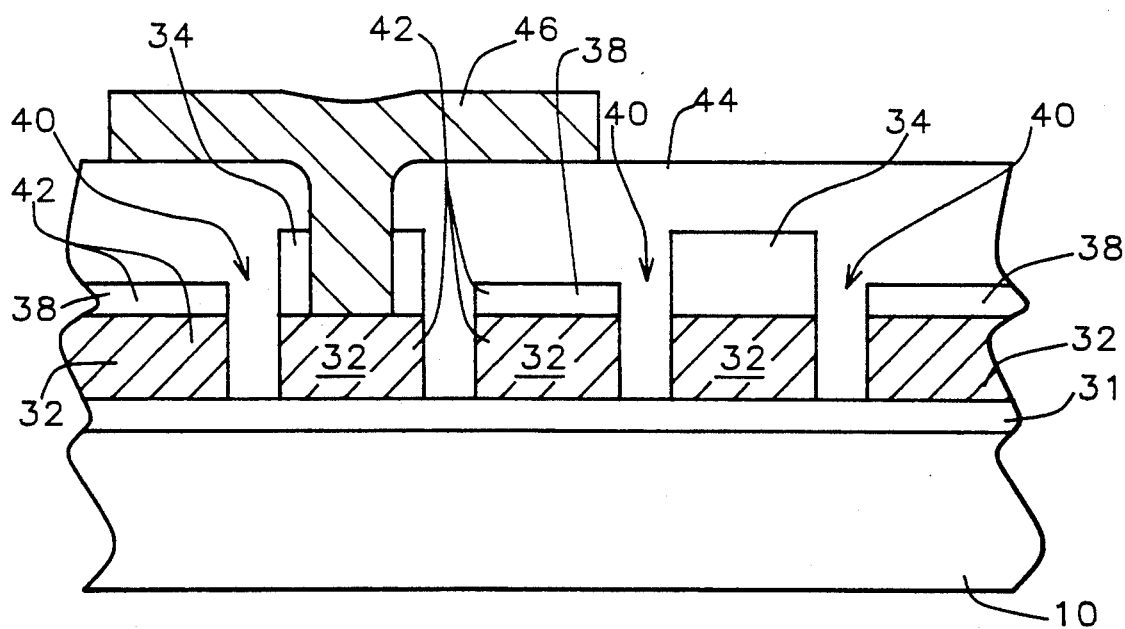
FIG. 14 shows a cross-section along 14—14 of FIG. 17.
Figure 17:
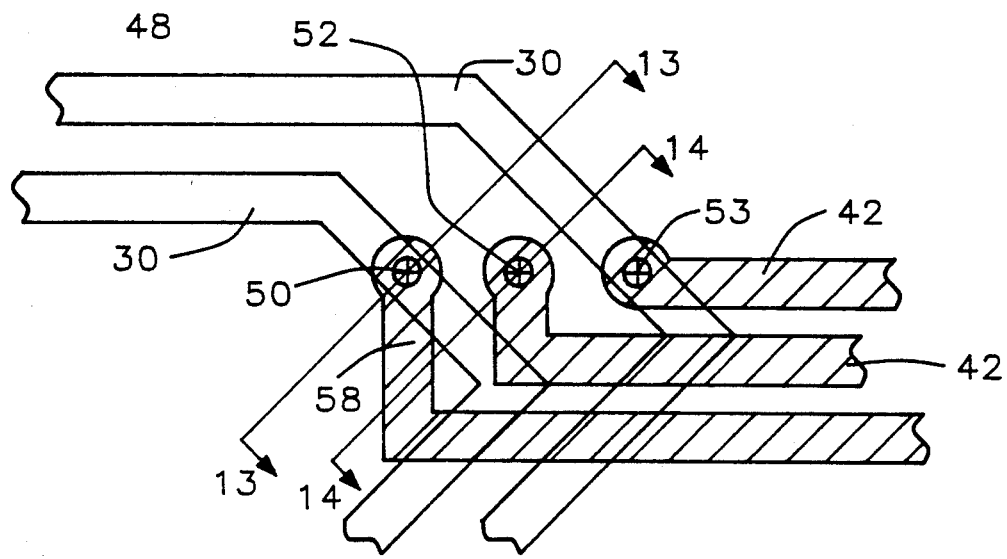
FIG. 17 is partial topview of one portion of the layout wherein cross-sectional views 13—13 and 14—14 are taken.

After the bit lines 30 and word lines 42 have been formed, a planarizing layer of silicon dioxide or phosphosilicate glass 44 is deposited over the word lines as shown in FIG. 13. This layer 44 has a preferred thickness of between about 1000 to 10000 Angstroms. A contact opening is made to the polysilicon layer 32 of a word line, using conventional lithography and etching techniques. A metal 46, such as AlSiCu, is sputter deposited, exposed and etched to complete the contact to a word line. FIG. 13 is the cross-section 13—13 of FIG. 17, illustrating the contact 50 to an odd word line (WL1, WL3, WL5). Contact 52 of FIG. 17 to an even word line (WL2, WL4) is illustrated in cross-section 14—14 in FIG. 14.

Figure 15:
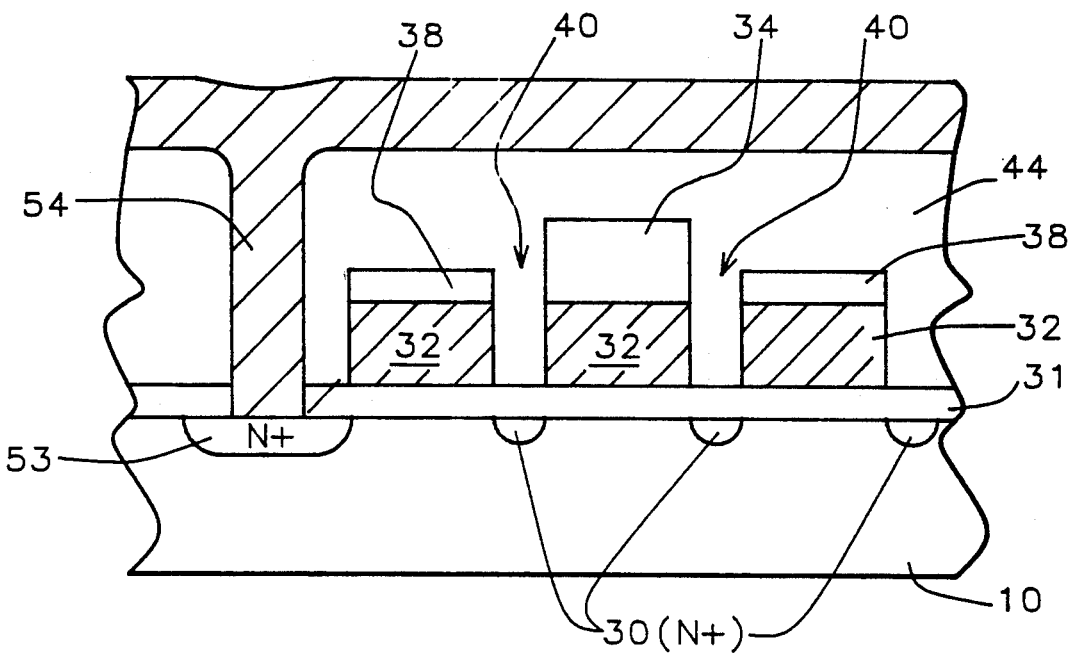
FIG. 15 shows a cross-section along 15—15 of FIG. 16.

Referring now to FIG. 15, a contact opening has been made to bit line 30 through planarizing layer 44 and gate oxide 31. Metal 46 completes the contact to bit line 30. FIG. 15 shows the cross-section 15—15 and contact 54 of FIG. 16 wherein it contacts the large source/drain side of BN+ 53 of the select transistor.

Figure 16:
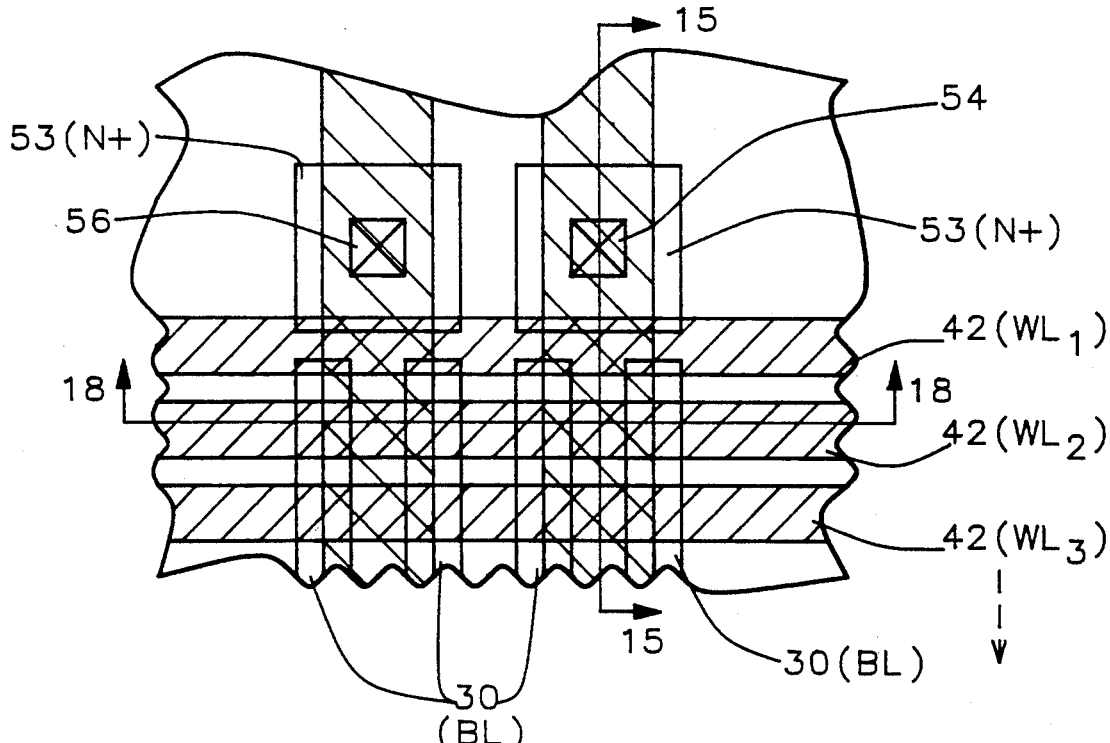
FIG. 16 is a schematic illustration of the top view of a portion of the completed integrated circuit.

FIG. 16 is a top view of a completed ROM or EPROM integrated circuit device and illustrates the planer view of the structure relationship of the word lines WL or 42 to the buried N+ bit lines BN+ or 30, including contacts 54 and 56 to BN+ regions 53 of select transistors.

FIG. 17 is the top view of the word line contact wherein cross-sectional views 13—13 and 14—14 are taken.

Figure 18:
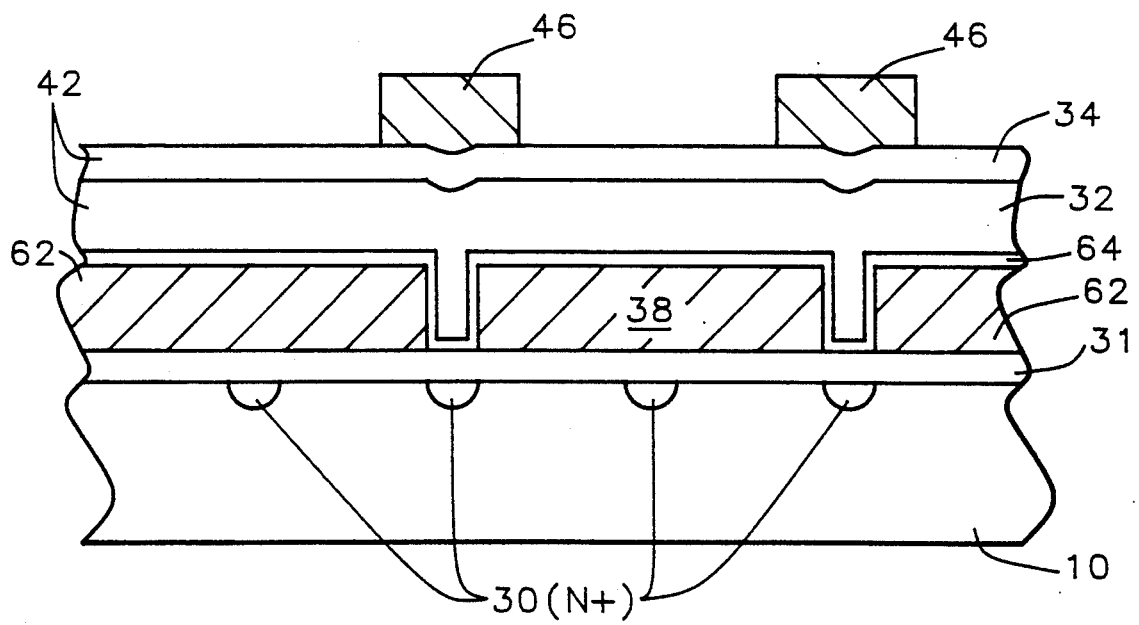
FIG. 18 is a cross-sectional representation of an EPROM integrated circuit formed by the process of the present invention.

The cross-section 18—18 of FIG. 16 illustrated in FIG. 18 shows a EPROM integrated circuit wherein lower electrode 62 is electrically isolated from the electrode 32 with insulator 64 as is known in the EPROM device technology. The preferred process sequence for forming an EPROM type IC device of FIG. 18 begins with the formation of bit lines 30 as described in detail above. Gate silicon oxide layer 31 is deposited as described above. A polysilicon layer 62 is deposited. A buffered HF etchant is used to remove silicon oxide from the polysilicon layer 62. A composite silicon oxide, silicon nitride and silicon oxide layer (ONO) is preferably used as the interpoly dielectric 64. The second polysilicon layer 32 is deposited and the layer is formed into closely spaced polysilicon word lines, WL or 42 in FIG. 16 by the method disclosed above. Further anisotropic etching is used to etch the first polysilicon layer 62 and ONO dielectric layer 64 as self aligned to the second polysilicon lines 42 which forms the floating gate structures 38 seen in FIG. 18.

The process then is continued as understood by those skilled in the art to form the required interconnection metallurgy and passivation to complete the integrated circuit of the invention.

The process of the invention results in closely spaced bit lines and word lines in ROM, EPROM, and Flash EPROM integrated circuits. Line spacing is less than about 0.8 micrometers for 0.8 micrometer feature size process and preferably between about 0.02 to 0.5 micrometers. The advantages of such a single level or layer polysilicon with very narrow line spacing allows the density to be double that of normal device in integrated circuits. For example, where a 32 Mbit ROM or EPROM integrated circuit could be designed using normal technology, this narrow line spacing would allow a 128 Mbit ROM or EPROM integrated circuit design since the density can be doubled in both the x and y directions. Further, the single level polysilicon line technology reduces the planarization problems of double polysilicon line technology.

While the invention has been particularly shown and described with reference to the preferred embodiments thereof, it will be understood by those skilled in the art that various changes in form and details may be made without departing from the spirit and scope of the invention. For example, refractory metal silicide, polycide and the like may be substituted for polysilicon lines.

What is claimed is:

1. The method of manufacturing closely spaced, parallel, single level polysilicon conductor lines which are perpendicular to buried N+ regions in a silicon substrate in a ROM integrated circuit comprising:

forming semiconductor device structures in and on a semiconductor substrate;

forming a first insulating layer structure over said semiconductor device structures;

forming a first conductive polysilicon layer over said first insulating layer;

forming a first silicon oxide layer over said first polysilicon layer and patterning said first oxide layer;

said patterning of said first oxide layer leaves a first pattern of said first oxide over a first designated plurality of polysilicon conductor lines and a second pattern between said first oxide which exposes said first polysilicon layer over a second designated plurality of polysilicon conductor lines plus the planned spacing between said first and second plurality of polysilicon conductor lines;

depositing a uniform thickness first silicon nitride layer over said first oxide layer and said first exposed polysilicon layer wherein said thickness is the width of said planned spacing;

· anisotropically etching said first nitride layer to produce first sidewall structures having the width of said planned spacing and leaving exposed portions of said first polysilicon layer of said second designated plurality of polysilicon lines;

oxidizing the exposed said first polysilicon layer;

removing said first sidewall structures by etching;

anisotropically etching the exposed said first polysilicon layer to form first said closely spaced polysilicon conductor lines;

removing said first oxide layers over said first polysilicon conductor lines;

implanting N+ ions into said silicon substrate under the spacing between said first polysilicon conductor lines to form said buried N+ regions;

removing said first exposed polysilicon layer and said first insulating layer;

forming a second insulating layer structure over said first closely spaced polysilicon conductor lines;

forming a second conductor polysilicon layer over said second insulating layer;

forming a second silicon oxide layer over said second polysilicon layer and patterning said second oxide layer;

said patterning of said second oxide layer leaves a first pattern of said second oxide over a first designated plurality of polysilicon conductor lines and a second pattern between said second oxide which expose said second polysilicon layer over a second designated plurality of polysilicon conductor lines plus the planned spacing between said first and second plurality of polysilicon conductor lines;

depositing a uniform thickness second silicon nitride layer over said second oxide layer and said second exposed polysilicon layer wherein said thickness is the width of said planned spacing;

anisotropically etching said second nitride layer to produce second sidewall structures having the width of said planned spacing and leaving exposed portions of said second polysilicon layer of said second designated plurality of polysilicon lines;

oxidizing the exposed said second polysilicon layer;

removing said second sidewall structures by etching;

anisotropically etching the exposed said second polysilicon layer to form second said closely spaced polysilicon conductor lines; and electrically connecting said first and second polysilicon lines to form said ROM integrated circuit.

2. The method of claim 1 wherein said buried N+ regions are connected as bit lines and said second polysilicon conductor lines are connected as word lines.

3. The method of claim 1 wherein said first and second polysilicon layers have a thickness of between about 1000 to 6000 Angstroms and are doped with phosphorus after deposition using phosphorus oxychloride.

4. The method of claim 1 wherein said first and second silicon oxide layers are formed to a thickness of between about 1000 to 6000 Angstroms.

5. The method of claim 1 wherein said first and second silicon nitride layers have a thickness of between about 500 to 5000 Angstroms.

6. The method of claim 1 wherein said anisotropic etching ambient for etching said polysilicon layers is composed of chlorine/helium.

7. The method of claim 1 wherein said etching of said silicon nitride sidewall layers is done using phosphoric acid.

8. The method of claim 1 wherein said first closely spaced polysilicon lines are used as closely spaced polysilicon bit lines, said second closely spaced polysilicon lines are used as closely spaced polysilicon word lines, and floating gate and gate dielectric structures are provided, and said lines and structures are connected as an EPROM integrated circuit.

9. The method of manufacturing closely spaced, parallel, single level polysilicon conductor lines which are perpendicular to buried N+ regions in a silicon substrate in a EPROM integrated circuit comprising:

forming semiconductor device structures in and on a semiconductor substrate;

forming a first insulating layer structure over said semiconductor device structures;

forming a first conductive polysilicon layer over said first insulating layer;

forming a first silicon oxide layer over said first polysilicon layer and patterning said first oxide layer;

said patterning of said first oxide layer leaves a first pattern of said first oxide over a first designated plurality of polysilicon conductor lines and a second pattern between said first oxide which exposes said first polysilicon layer over a second designated plurality of polysilicon conductor lines plus the planned spacing between said first and second plurality of polysilicon conductor lines;

depositing a uniform thickness first silicon nitride layer over said first oxide layer and said first exposed polysilicon layer wherein said thickness is the width of said planned spacing;

anisotropically etching said first nitride layer to produce first sidewall structures having the width of said planned spacing and leaving exposed portions of said first polysilicon layer of said second designated plurality of polysilicon lines;

oxidizing the exposed said first polysilicon layer;

removing said first sidewall structures by etching;

anisotropically etching the exposed said first polysilicon layer to form first said closely spaced polysilicon conductor lines;

removing said first oxide layers over said first polysilicon conductor lines;

implanting N+ ions into said silicon substrate under the spacing between said first polysilicon conductor lines to form said buried N+ regions;

removing said first exposed polysilicon layer and said first insulating layer;

forming a second insulating layer structure over said first closely spaced polysilicon conductor lines;

forming a second conductor polysilicon layer over said second insulating layer;

forming a second silicon oxide layer over said second polysilicon layer and patterning said second oxide layer;

said patterning of said second oxide layer leaves a first pattern of said second oxide over a first designated plurality of polysilicon conductor lines and a second pattern between said second oxide which expose said second polysilicon layer over a second designated plurality of polysilicon conductor lines plus the planned spacing between said first and second plurality of polysilicon conductor lines;

depositing a uniform thickness second silicon nitride layer over said second oxide layer and said second exposed polysilicon layer wherein said thickness is the width of said planned spacing;

anisotropically etching said second nitride layer to produce second sidewall structures having the width of said planned spacing and leaving exposed portions of said second polysilicon layer of said second designated plurality of polysilicon lines;

oxidizing the exposed said second polysilicon layer;

removing said second sidewall structures by etching;

anisotropically etching the exposed said second polysilicon layer to form second said closely spaced polysilicon conductor lines; and electrically connecting said first polysilicon lines as bit lines, floating gate structures and said second polysilicon lines as word lines to form said EPROM integrated circuit.

10. The method of claim 9 wherein said first and second polysilicon layers have a thickness of between about 1000 to 6000 Angstroms and are doped with phosphorus after deposition using phosphorus oxychloride.

11. The method of claim 9 wherein said silicon oxide layers are formed to a thickness of between about 1000 to 6000 Angstroms.

12. The method of claim 9 wherein said silicon nitride layers have a thickness of between about 500 to 5000 Angstroms.

13. The method of claim 9 wherein the said polysilicon lines are spaced less than about 0.8 micrometers from one another.

14. The method of claim 13 wherein said polysilicon lines are spaced less than about 0.3 micrometers from one another.

15. The method of claim 9 wherein said etching of said sidewall structures is by hot phosphoric acid.

* * * * *